United States Patent
Tanigawa et al.

(10) Patent No.: US 10,808,308 B2
(45) Date of Patent: Oct. 20, 2020

(54) THERMAL BARRIER COATING, TURBINE MEMBER, AND GAS TURBINE

(71) Applicant: MITSUBISHI HEAVY INDUSTRIES, LTD., Tokyo (JP)

(72) Inventors: Shuji Tanigawa, Tokyo (JP); Masahiko Mega, Tokyo (JP); Taiji Torigoe, Tokyo (JP); Yoshifumi Okajima, Tokyo (JP); Daisuke Kudo, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/306,635

(22) PCT Filed: Jun. 6, 2017

(86) PCT No.: PCT/JP2017/020912
§ 371 (c)(1),
(2) Date: Dec. 3, 2018

(87) PCT Pub. No.: WO2017/213113
PCT Pub. Date: Dec. 14, 2017

(65) Prior Publication Data
US 2019/0119804 A1  Apr. 25, 2019

(30) Foreign Application Priority Data
Jun. 8, 2016 (JP) ................. 2016-114261

(51) Int. Cl.
*C23C 4/11* (2016.01)
*C23C 4/073* (2016.01)
(Continued)

(52) U.S. Cl.
CPC ............ *C23C 4/11* (2016.01); *C04B 41/4527* (2013.01); *C04B 41/522* (2013.01);
(Continued)

(58) Field of Classification Search
None
See application file for complete search history.

(56) References Cited

U.S. PATENT DOCUMENTS 4,814,575 A * 3/1989 Petitbon ................. B05B 7/228
219/121.64
5,169,674 A * 12/1992 Miller ....................... C23C 4/02
427/367
(Continued)

FOREIGN PATENT DOCUMENTS

CN 101004142 7/2007
CN 101081735 12/2007
(Continued)

OTHER PUBLICATIONS

Machine Translation of JP 07243018 A, Sep. 1995 (Year: 1995).*
(Continued)

*Primary Examiner* — Jeffrey A Vonch
(74) *Attorney, Agent, or Firm* — Wenderoth, Lind & Ponack, L.L.P.

(57) ABSTRACT

A thermal barrier coating includes a highly porous layer and a dense layer. The highly porous layer is formed on a heat-resistant base, is made of ceramic, has pores, has a layer thickness of equal to or larger than 0.3 mm and equal to or smaller than 1.0 mm, and has a pore ratio of equal to or higher than 1 vol % and equal to or lower than 30 vol %. The dense layer is formed on the highly porous layer, is made of ceramic, has a pore ratio of equal to or lower than 0.9 vol % that is equal to or lower than the pore ratio of the highly porous layer, and has a layer thickness of equal to or smaller than 0.05 mm.

16 Claims, 2 Drawing Sheets

(51) Int. Cl.

| | | |
|---|---|---|
| *C23C 4/134* | (2016.01) | |
| *C23C 4/18* | (2006.01) | |
| *F01D 5/28* | (2006.01) | |
| *C23C 28/04* | (2006.01) | |
| *C23C 28/00* | (2006.01) | |
| *C04B 41/52* | (2006.01) | |
| *C04B 41/45* | (2006.01) | |
| *F01D 25/14* | (2006.01) | |
| *F01D 9/04* | (2006.01) | |
| *F23R 3/42* | (2006.01) | |
| *F02C 7/00* | (2006.01) | |
| *C23C 16/448* | (2006.01) | |
| *C23C 24/04* | (2006.01) | |
| *C04B 41/50* | (2006.01) | |
| *C04B 41/00* | (2006.01) | |
| *F02C 7/24* | (2006.01) | |

(52) U.S. Cl.
CPC .......... *C04B 41/524* (2013.01); *C04B 41/526* (2013.01); *C23C 4/073* (2016.01); *C23C 4/134* (2016.01); *C23C 4/18* (2013.01); *C23C 28/042* (2013.01); *C23C 28/048* (2013.01); *C23C 28/3455* (2013.01); *F01D 5/28* (2013.01); *F01D 5/286* (2013.01); *F01D 5/288* (2013.01); *F01D 9/041* (2013.01); *F01D 25/145* (2013.01); *C04B 41/0036* (2013.01); *C04B 41/5041* (2013.01); *C04B 41/5042* (2013.01); *C23C 16/4486* (2013.01); *C23C 24/04* (2013.01); *C23C 28/3215* (2013.01); *F02C 7/00* (2013.01); *F02C 7/24* (2013.01); *F05B 2230/90* (2013.01); *F05D 2220/32* (2013.01); *F05D 2230/30* (2013.01); *F05D 2230/312* (2013.01); *F05D 2230/90* (2013.01); *F05D 2240/12* (2013.01); *F05D 2240/24* (2013.01); *F05D 2260/95* (2013.01); *F05D 2300/134* (2013.01); *F05D 2300/20* (2013.01); *F05D 2300/21* (2013.01); *F05D 2300/2118* (2013.01); *F05D 2300/506* (2013.01); *F05D 2300/5023* (2013.01); *F05D 2300/514* (2013.01); *F05D 2300/611* (2013.01); *F05D 2300/6111* (2013.01); *F05D 2300/701* (2013.01); *F23R 3/42* (2013.01); *Y10T 428/12611* (2015.01); *Y10T 428/12618* (2015.01); *Y10T 428/2495* (2015.01); *Y10T 428/24331* (2015.01); *Y10T 428/24471* (2015.01); *Y10T 428/24983* (2015.01); *Y10T 428/24992* (2015.01); *Y10T 428/24999* (2015.04); *Y10T 428/249981* (2015.04); *Y10T 428/249989* (2015.04)

(56) References Cited

U.S. PATENT DOCUMENTS

| | | | | |
|---|---|---|---|---|
| 5,350,599 | A * | 9/1994 | Rigney | C23C 14/083 427/255.7 |
| 5,484,980 | A * | 1/1996 | Pratt | B23K 26/08 219/121.65 |
| 5,683,825 | A * | 11/1997 | Bruce | C23C 28/00 427/248.1 |
| 5,955,182 | A * | 9/1999 | Yasuda | B32B 15/04 428/217 |
| 6,060,177 | A * | 5/2000 | Bornstein | C23C 4/02 428/623 |
| 6,071,627 | A * | 6/2000 | Yasuda | C23C 28/00 428/610 |
| 6,165,600 | A * | 12/2000 | Ivkovich, Jr. | B32B 18/00 123/1 R |
| 6,511,762 | B1 * | 1/2003 | Lee | B32B 18/00 428/697 |
| 6,558,814 | B2 * | 5/2003 | Spitsberg | C04B 41/009 416/241 B |
| 6,703,137 | B2 * | 3/2004 | Subramanian | C23C 4/18 416/241 B |
| 6,875,529 | B1 * | 4/2005 | Spitsberg | C04B 35/486 416/241 B |
| 7,833,586 | B2 | 11/2010 | Margolies | |
| 7,862,901 | B2 * | 1/2011 | Darolia | C23C 28/3215 428/632 |
| 2002/0141868 | A1 * | 10/2002 | Lee | C23C 28/00 416/97 A |
| 2002/0160189 | A1 * | 10/2002 | Wataya | C04B 35/50 428/402 |
| 2003/0138658 | A1 * | 7/2003 | Taylor | C23C 28/321 428/632 |
| 2004/0002221 | A1 * | 1/2004 | O'Donnell | C23C 16/4404 438/710 |
| 2004/0028941 | A1 * | 2/2004 | Lane | C04B 41/009 428/689 |
| 2004/0110016 | A1 * | 6/2004 | Hamaya | C23C 4/11 428/472 |
| 2004/0110021 | A1 * | 6/2004 | Seth | F01D 5/005 428/553 |
| 2004/0115406 | A1 * | 6/2004 | Nagaraj | C23C 28/3215 428/209 |
| 2004/0126599 | A1 * | 7/2004 | Wigren | C23C 28/04 428/472 |
| 2004/0156724 | A1 * | 8/2004 | Torigoe | C23C 28/3215 416/241 R |
| 2004/0229031 | A1 * | 11/2004 | Gell | C04B 35/486 428/323 |
| 2004/0229078 | A1 * | 11/2004 | Maeda | C23C 4/11 428/650 |
| 2005/0013994 | A1 * | 1/2005 | Strangman | C23C 18/1225 428/336 |
| 2005/0112412 | A1 * | 5/2005 | Darolia | C23C 28/321 428/702 |
| 2005/0136249 | A1 * | 6/2005 | Arikawa | C23C 28/3455 428/332 |
| 2005/0221109 | A1 * | 10/2005 | Torigoe | C23C 28/3455 428/633 |
| 2006/0019119 | A1 * | 1/2006 | Spitsberg | C23C 14/08 428/701 |
| 2006/0151856 | A1 * | 7/2006 | Torigoe | F01D 5/288 257/632 |
| 2007/0026246 | A1 * | 2/2007 | Harada | C23C 28/345 428/469 |
| 2007/0036997 | A1 * | 2/2007 | Floyd | C23C 28/3215 428/472 |
| 2007/0077456 | A1 * | 4/2007 | Kitamura | C23C 4/11 428/701 |
| 2007/0082131 | A1 | 4/2007 | Doesburg et al. | |
| 2007/0098912 | A1 * | 5/2007 | Raybould | C23C 24/04 427/446 |
| 2007/0140840 | A1 * | 6/2007 | Schmitz | C23C 30/00 415/200 |
| 2007/0148478 | A1 * | 6/2007 | Schmitz | C23C 28/324 428/469 |
| 2007/0172703 | A1 | 7/2007 | Freling et al. | |
| 2007/0215283 | A1 * | 9/2007 | Kobayashi | H01J 37/32477 156/345.43 |
| 2007/0218302 | A1 * | 9/2007 | Kobayashi | C23C 4/18 428/469 |
| 2008/0044662 | A1 * | 2/2008 | Schlichting | C23C 28/3215 428/426 |
| 2008/0145629 | A1 * | 6/2008 | Anoshkina | C23C 30/00 428/213 |
| 2008/0176097 | A1 * | 7/2008 | Schlichting | F01D 5/288 428/660 |
| 2008/0199709 | A1 * | 8/2008 | Ishiwata | C23C 14/025 428/457 |
| 2008/0220209 | A1 * | 9/2008 | Taylor | F01D 5/288 428/134 |

(56) References Cited

U.S. PATENT DOCUMENTS

| | | | | |
|---|---|---|---|---|
| 2009/0053069 | A1* | 2/2009 | Barnikel | C23C 28/36 416/241 R |
| 2009/0214825 | A1 | 8/2009 | Sun et al. | |
| 2009/0258214 | A1* | 10/2009 | Bayer | C23C 16/44 428/304.4 |
| 2009/0280298 | A1* | 11/2009 | Rosenzweig | C23C 4/11 428/156 |
| 2009/0311508 | A1* | 12/2009 | Stamm | C23C 28/3215 428/316.6 |
| 2010/0136349 | A1* | 6/2010 | Lee | C04B 41/009 428/446 |
| 2010/0242477 | A1* | 9/2010 | Duval | C23C 28/00 60/645 |
| 2010/0272982 | A1* | 10/2010 | Dickinson | C23C 4/10 428/304.4 |
| 2010/0296943 | A1* | 11/2010 | Lee | C04B 41/009 416/241 R |
| 2010/0304084 | A1* | 12/2010 | Anand | C23C 4/18 428/141 |
| 2010/0304181 | A1* | 12/2010 | Anand | C23C 28/34 428/627 |
| 2010/0330391 | A1* | 12/2010 | Arikawa | C23C 28/321 428/613 |
| 2011/0086177 | A1* | 4/2011 | Ma | C23C 28/3215 427/446 |
| 2011/0236657 | A1* | 9/2011 | Feist | C23C 28/3455 428/213 |
| 2011/0244216 | A1* | 10/2011 | Meyer | C23C 4/11 428/316.6 |
| 2011/0300357 | A1 | 12/2011 | Witz et al. | |
| 2012/0167573 | A1* | 7/2012 | Belousov | C23C 28/3215 60/752 |
| 2012/0183790 | A1* | 7/2012 | Petorak | C04B 35/488 428/450 |
| 2012/0196139 | A1* | 8/2012 | Petorak | C23C 4/06 428/472 |
| 2012/0231211 | A1* | 9/2012 | von Niessen | C23C 28/3215 428/119 |
| 2012/0276352 | A1* | 11/2012 | Liu | F01D 5/288 428/215 |
| 2012/0276355 | A1* | 11/2012 | Sansom | F01D 5/288 428/218 |
| 2013/0052451 | A1* | 2/2013 | Sano | C23C 4/11 428/312.8 |
| 2013/0095344 | A1* | 4/2013 | Nagaraj | C23C 28/3215 428/623 |
| 2013/0101745 | A1* | 4/2013 | Meillot | C23C 4/00 427/455 |
| 2013/0137051 | A1* | 5/2013 | Beyer | C01B 3/36 431/2 |
| 2013/0186304 | A1* | 7/2013 | Pabla | C23C 24/04 106/287.19 |
| 2013/0202912 | A1* | 8/2013 | Torigoe | C23C 4/12 428/633 |
| 2013/0260132 | A1* | 10/2013 | Hazel | C23C 28/347 428/304.4 |
| 2013/0344349 | A1* | 12/2013 | Hugot | F01D 5/288 428/610 |
| 2014/0220378 | A1* | 8/2014 | Nagaraj | C23C 4/11 428/623 |
| 2014/0302247 | A1* | 10/2014 | Inaba | B23K 26/34 427/493 |
| 2014/0308479 | A1* | 10/2014 | Parakala | C23C 28/3455 428/155 |
| 2014/0315006 | A1* | 10/2014 | Stamm | C23C 28/345 428/213 |
| 2014/0360407 | A1* | 12/2014 | Kitamura | C23C 4/11 106/286.1 |
| 2015/0044444 | A1* | 2/2015 | Gell | C23C 4/10 428/220 |
| 2015/0147524 | A1* | 5/2015 | Petorak | C23C 28/048 428/141 |
| 2015/0197456 | A1* | 7/2015 | Oboodi | F01D 5/284 428/142 |
| 2016/0010471 | A1* | 1/2016 | Pabla | C04B 35/62884 428/328 |
| 2016/0017475 | A1* | 1/2016 | Hazel | C23C 4/11 428/212 |
| 2016/0068941 | A1* | 3/2016 | Nair | B05B 7/226 423/263 |
| 2016/0251971 | A1* | 9/2016 | Dusterhoft | F01D 5/288 428/213 |
| 2016/0254125 | A1* | 9/2016 | Huang | C23C 4/11 29/458 |
| 2017/0073277 | A1* | 3/2017 | Shim | C04B 41/52 |
| 2017/0250057 | A1* | 8/2017 | Simpson | C04B 35/581 |
| 2017/0298519 | A1* | 10/2017 | Degel | C23C 28/3455 |
| 2018/0030584 | A1* | 2/2018 | Inoue | C23C 28/32 |
| 2018/0030589 | A1* | 2/2018 | Sun | C23C 28/046 |
| 2018/0135157 | A1* | 5/2018 | Jeong | C23C 4/123 |

FOREIGN PATENT DOCUMENTS

| | | | | |
|---|---|---|---|---|
| CN | 101265561 | A * | 9/2008 | |
| CN | 101994078 | A * | 3/2011 | |
| CN | 102084020 | | 6/2011 | |
| CN | 102245810 | | 11/2011 | |
| DE | 102015200076 | A1 * | 7/2016 | F01D 5/288 |
| EP | 2000557 | A1 * | 12/2008 | C25D 13/02 |
| JP | 59-096273 | | 6/1984 | |
| JP | 61030658 | A * | 2/1986 | C23C 4/18 |
| JP | 61104062 | A * | 5/1986 | C23C 4/18 |
| JP | 63004051 | A * | 1/1988 | |
| JP | 63241152 | A * | 10/1988 | |
| JP | 01-104756 | | 4/1989 | |
| JP | 01268854 | A * | 10/1989 | |
| JP | 02004951 | A * | 1/1990 | |
| JP | 02274863 | A * | 11/1990 | |
| JP | 06306639 | A * | 11/1994 | |
| JP | 07243018 | A * | 9/1995 | |
| JP | 07331456 | A * | 12/1995 | |
| JP | 09067662 | A * | 3/1997 | |
| JP | 11061438 | A * | 3/1999 | C23C 28/3215 |
| JP | 2000144365 | A * | 5/2000 | |
| JP | 2002069607 | A * | 3/2002 | |
| JP | 2003160852 | A * | 6/2003 | |
| JP | 2005163172 | A * | 6/2005 | |
| JP | 2005163185 | A * | 6/2005 | |
| JP | 2006144061 | A * | 6/2006 | |
| JP | 2008127614 | A * | 6/2008 | |
| JP | 2008266724 | A * | 11/2008 | |
| JP | 2009041059 | A * | 2/2009 | |
| JP | 2009293058 | A * | 12/2009 | |
| JP | 2010-242223 | | 10/2010 | |
| JP | 2011-140693 | | 7/2011 | |
| JP | 2011167994 | A * | 9/2011 | |
| JP | 2012067364 | A * | 4/2012 | |
| JP | 2013-185202 | | 9/2013 | |
| JP | 2014098175 | A * | 5/2014 | |
| JP | 5554488 | | 6/2014 | |
| JP | 5737996 | | 5/2015 | |
| JP | 2015113255 | A * | 6/2015 | |
| JP | 2015175315 | A * | 10/2015 | |
| JP | 2015-218379 | | 12/2015 | |
| KR | 20110101758 | A * | 9/2011 | |
| WO | WO-2005071228 | A1 * | 8/2005 | C23C 28/3215 |
| WO | WO-2006099869 | A1 * | 9/2006 | C23C 4/18 |
| WO | WO-2006128424 | A1 * | 12/2006 | H01M 18/1253 |
| WO | WO-2014123323 | A1 * | 8/2014 | C04B 41/87 |
| WO | WO-2015165662 | A1 * | 11/2015 | C23C 4/11 |
| WO | WO-2016147282 | A1 * | 9/2016 | F01D 5/28 |

OTHER PUBLICATIONS

Machine Translation of JP-09067662-A, Mar. 1997 (Year: 1997).*
Machine Translation of JP-2000144365-A, May 2000 (Year: 2000).*
Machine Translation of JP-2002069607-A, Mar. 2002 (Year: 2002).*
Machine Translation of JP-2003160852-A, Jun. 2003 (Year: 2003).*
Machine Translation of JP-2008266724-A, Nov. 2008 (Year: 2008).*

(56) References Cited

OTHER PUBLICATIONS

Saral et al., Thermal cycle properties of plasma sprayed YSZ/Al2O3 thermal barrier coatings, Oct. 2009, Surface Engineering, vol. 20, Issue 7, pp. 541-547 (Year: 2009).*

Zhu et al., Thin Yttria-Stabilized Zirconia Coatings Deposited by Low-Energy Plasma Spraying Under Very Low Pressure Condition, Sep. 2011, Journal of Thermal Spray Technology, vol. 20, Issue 5, pp. 1118-1124 (Year: 2011).*

Kern et al., Abstract for Ytterbia (2.25 mol.-%) stabilised zirconia (Yb-TZP) manufactured from coated nanopowder, Aug. 2012, Advances in Applied Ceramics, vol. 111, Issues 5&6, pp. 275-279 (Year: 2012).*

He et al., Characterization of Yttria-Stabilized Zirconia Coatings Deposited by Low-Pressure Plasma Spraying, Feb. 2016, Journal of Thermal Spray Technology, vol. 25, Issue 3, pp. 558-566 (Year: 2016).*

Xiaorui et al., Mechanical properties of high-temperature-degraded yttria-stabilized zirconia, May 2014, Acta Materialia, vol. 69, pp. 397-406 (Year: 2014).*

Keshavarz et al., Mechanical properties of stabilized zirconia nanocrystalline EB-PVD coating evaluated by micro and nano indentation, Dec. 2013, Journal of Advanced Ceramics, vol. 2, pp. 333-340 (Year: 2013).*

Guo et al., Atmospheric plasma sprayed thick thermal barrier coatings with high segmentation crack density, Sep. 2004, Surface and Coatings Technology, vol. 186, Issue 3, pp. 353-363 (Year: 2004).*

Iwasawa et al., Plasma-Resistant Dense Yttrium Oxide Film Prepared by Aerosol Deposition Process, Jun. 2007, Journal of the American Ceramic Society, vol. 90, Issue 8, pp. 2327-2332 (Year: 2007).*

Karabas et al.. Effect of Air Plasma Spray Parameters on the Properties of YSZ and CYSZ Thermal Barrier Coatings, Jan. 2016, Journal of the Australian Ceramic Society, vol. 52, pp. 175-182 (Year: 2016).*

International Search Report dated Jul. 11, 2018 in International (PCT) Application No. PCT/JP2017/020912.

Written Opinion of the International Searching Authority dated Jul. 11, 2017 in International (PCT) Application No. PCT/JP2017/020912, with English-language translation.

Oguma et al., "Development of Advanced Materials and Manufacturing Technology for High-efficiency Gas Turbine", Mitsubishi Juko Giho Shinseihin-Shingijutsu Tokushu, 2015, vol. 52, No. 4, pp. 5-14.

Office Action dated Mar. 18, 2020 in corresponding Chinese Patent Application No. 201780034914.1, with an English translation.

\* cited by examiner ated States Patent No. 10,808,308 B2

THERMAL BARRIER COATING, TURBINE MEMBER, AND GAS TURBINE

FIELD

The present invention relates to a thermal barrier coating, and a turbine member and a gas turbine including the thermal barrier coating.

BACKGROUND

Japanese Patent No. 5737996, for example, describes a thermal barrier coating produced by a method for producing a thermal barrier coating. The method for producing the thermal barrier coating includes a step of forming a metal bonding layer on a heat-resistant base and a step of forming a ceramic layer on the metal bonding layer. The step of forming the ceramic layer includes a stage of forming a highly porous layer including pores by thermal spraying on the metal bonding layer, a stage of forming a dense layer having a structure denser than that of the highly porous layer on the highly porous layer, and a stage of polishing the top surface of the dense layer such that the dense layer has a predetermined thickness.

Japanese Patent No. 5554488, for example, describes a coating system including a thermal barrier coating containing a chemically stabilized zirconia material provided on a metal component and a thermally sprayed alumina-based coating disposed on the thermal barrier coating. The alumina-based coating contains at least 87 wt % alumina based on the total weight of the alumina-based coating and has a thickness effective to increase the melting point of a contaminant composition containing mixed calcium-magnesium-aluminum-silicon-oxides. The average surface roughness of the thermally sprayed alumina-based coating is smaller than 4.0 µm to approximately 0.75 µm.

Japanese Patent No. 5737996 describes a typical conventional thermal barrier coating (TBC) having a two-layer structure in which a metal bonding layer and a ceramic layer are formed in order. An object of the conventional TBC is to secure a high heat-shielding property and has high erosion resistance and a smooth surface. As described above, Japanese Patent No. 5737996 provides the ceramic layer including a highly porous layer and a dense layer formed on the highly porous layer.

In oil-burning gas turbine plants using petroleum as fuel, however, turbine blades and turbine vanes serving as turbine members are exposed to an environment including high-temperature corrosive substances (e.g., $Na_2SO_4$ and $CaSO_4$). The high-temperature corrosive substances penetrate into a TBC, thereby reducing the Life of the TBC. As a result, the TBC may possibly peel off.

To address the disadvantage described above, an object of the present invention is to provide a thermal barrier coating, a turbine member, and a gas turbine that can secure the heat-shielding property and the erosion resistance and increase the corrosion resistance.

SUMMARY OF THE INVENTION

To achieve the object described above, a thermal barrier coating according to an aspect of the present invention includes a highly porous layer formed on a heat-resistant base, made of ceramic, and having pores; and a dense layer formed on the highly porous layer, made of ceramic, having a pore ratio of equal to or lower than 0.9 vol % that is equal to or lower than the pore ratio of the highly porous layer, having a layer thickness of equal to or smaller than 0.05 mm, and having a Vickers hardness of equal to or higher than 800 Hv.

This thermal barrier coating can secure the heat-shielding property, for the heat-resistance base, in the highly porous layer. With the dense layer formed on the highly porous layer and serving as a hard film having denseness in the pore ratio and the Vickers hardness, the thermal barrier coating can secure the erosion resistance. Having denseness in the pore ratio of the dense layer can prevent penetration of corrosive components and increase the corrosion resistance. As a result, the thermal barrier coating can have higher durability in a high-temperature corrosive environment.

To achieve the object described above, a thermal barrier coating according to an aspect of the present invention includes a metal bonding layer formed on a heat-resistant base; a highly porous layer formed on the metal bonding layer, made of ceramic, and having pores; and a dense layer formed on the highly porous layer, made of ceramic, having a pore ratio of equal to or lower than 0.9 vol % that is equal to or lower than the pore ratio of the highly porous layer, having a layer thickness of equal to or smaller than 0.05 mm, and having a Vickers hardness of equal to or higher than 800 Hv.

This thermal barrier coating can secure the heat-shielding property, for the heat-resistant base, in the highly porous layer bonded to the heat-resistant base with the metal bonding layer. With the dense layer formed on the highly porous layer and serving as a hard film having denseness in the pore ratio and the Vickers hardness, the thermal barrier coating can secure the erosion resistance. Having denseness in the pore ratio of the dense layer can prevent penetration of corrosive components and increase the corrosion resistance. As a result, the thermal barrier coating can have higher durability in a high-temperature corrosive environment.

Further, the thermal barrier coating according to an aspect of the present invention preferably further includes a molten layer formed on the dense layer by melting the dense layer.

In this thermal barrier coating, the molten layer is formed by melting the outer layer of the dense layer having a pore ratio of equal to or lower than 0.9 vol %, and the melting makes the surface of the dense layer denser. Consequently, the thermal barrier coating can further increase the corrosion resistance. As a result, the thermal barrier coating can have higher durability in a high-temperature corrosive environment.

Further, in the thermal barrier coating according to an aspect of the present invention, the layer thickness of the dense layer under the molten layer is preferably equal to or larger than 0.01 mm.

In this thermal barrier coating, while the molten layer may possibly have lower strength because of its high denseness, such a reduction in the strength can be suppressed by making the layer thickness of the dense layer under the molten layer equal to or larger than 0.01 mm.

Further, in the thermal barrier coating according to an aspect of the present invention, it is preferable that one of the highly porous layer and the dense layer is made of an yttria-stabilized zirconia material, and the other is made of an ytterbia-stabilized zirconia material.

In this thermal barrier coating, one of the highly porous layer and the dense layer is made of the yttria-stabilized zirconia material, and the other thereof is made of the ytterbia-stabilized zirconia material. With this configuration, the thermal barrier coating can significantly secure the heat-shielding property, for the heat-resistant base, in the highly porous layer. In addition, the thermal barrier coating can secure the erosion resistance in the dense layer and significantly increase the corrosion resistance. As a result, the thermal barrier coating can have higher durability in a high-temperature corrosive environment.

Further, in the thermal barrier coating according to an aspect of the present invention, the highly porous layer and the dense layer are preferably made of an ytterbia-stabilized zirconia material.

In this thermal barrier coating, the highly porous layer and the dense layer are made of the ytterbia-stabilized zirconia material. Consequently, the thermal barrier coating can have high heat-shielding, durability, and corrosion-resistant functions.

To achieve the object described above, a turbine member according to an aspect of the present invention includes any one of the thermal barrier coatings described above on a surface.

This turbine member includes any one of the thermal barrier coatings described above having a high heat-shielding property, high erosion resistance, and high corrosion resistance. Consequently, the turbine member can be applied to a gas turbine member used at 1600 degrees C., for example.

To achieve the object described above, a gas turbine according to an aspect of the present invention includes the turbine member described above.

This gas turbine includes the gas turbine member having a high heat-shielding property, high erosion resistance, and high corrosion resistance. Consequently, the gas turbine has higher durability.

Advantageous Effects of Invention

The present invention can secure the heat shielding property and the erosion resistance and increase the corrosion resistance.

DESCRIPTION OF EMBODIMENTS

Exemplary embodiments according to the present invention are described below in greater detail with reference to the accompanying drawings. The embodiments are not intended to limit the present invention. Components according to the embodiments below include components capable of being easily replaced by those skilled in the art and components substantially identical therewith.

Figure 1:
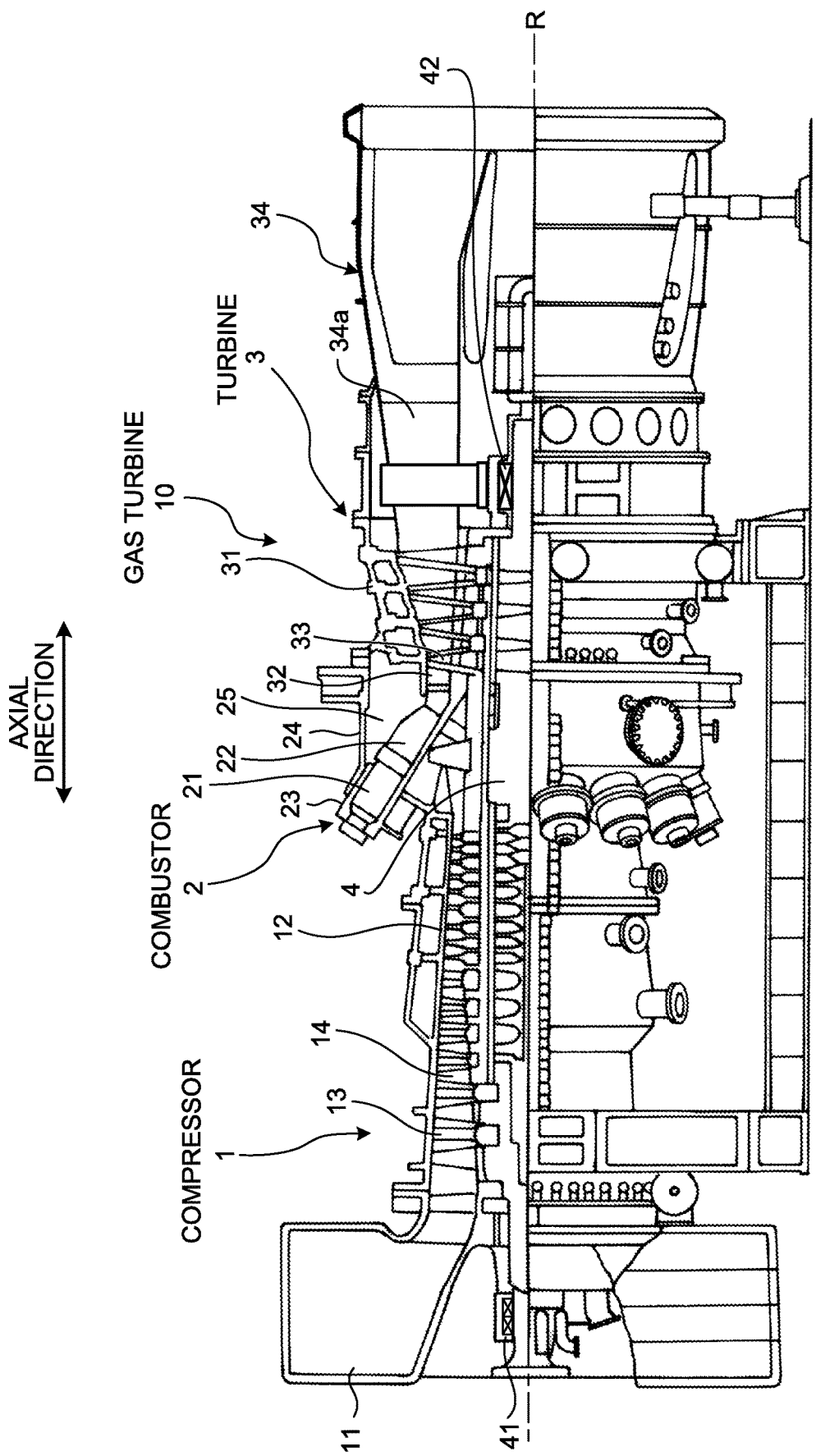
FIG. 1 is a schematic configuration diagram of a gas turbine according to an embodiment of the present invention.

FIG. 1 is a schematic configuration diagram of a gas turbine according to the present embodiment.

While the present embodiment describes as an example an industrial gas turbine 10 illustrated in FIG. 1, examples of the embodiment include other gas turbines, such as aviation gas turbines.

As illustrated in FIG. 1, the gas turbine 10 includes a compressor 1, combustors 2, and a turbine 3. In the gas turbine 10, a turbine shaft 4 serving as a rotating shaft is disposed penetrating the center of the compressor 1, the combustors 2, and the turbine 3. The compressor 1, the combustors 2, and the turbine 3 are provided in a row in this order from the upstream side to the downstream side of an air flow along an axis R of the turbine shaft 4. In the following description, an axial direction indicates a direction parallel to the axis R. A circumferential direction indicates a direction of circumference about the axis R. A radial direction indicates a direction orthogonal to the axis R.

The compressor 1 compresses air to generate compressed air. The compressor 1 includes compressor vanes 13 and compressor blades 14 in a compressor casing 12 having an air intake port 11 through which air is taken in. The compressor vanes 13 are attached to the compressor casing 12 and provided in a row in the circumferential direction. The compressor blades 14 are attached to the turbine shaft 4 and provided in a row in the circumferential direction. The compressor vanes 13 and the compressor blades 14 are alternately provided along the axial direction.

The combustors 2 supply fuel to compressed air compressed by the compressor 1, thereby generating a high-temperature and high-pressure combustion gas. The combustors 2 each include an inner cylinder 21, a transition piece 22, and an outer casing 23. The inner cylinder 21 serving as a combustion chamber mixes and combusts the compressed air and the fuel. The transition piece 22 guides the combustion gas from the inner cylinder 21 to the turbine 3. The outer casing 23 covers the outer periphery of the inner cylinder 21 and defines an air passage 25 that guides the compressed air from the compressor 1 to the inner cylinder 21. A plurality of (e.g., 16) combustors 2 are provided in a row in the circumferential direction in a combustor casing 24.

The turbine 3 generates rotational power from the combustion gas combusted by the combustors 2. The turbine 3 includes turbine vanes 32 and turbine blades 33 in a turbine casing 31. The turbine vanes 32 are attached to the turbine casing 31 and provided in a row in the circumferential direction. The turbine blades 33 are attached to the turbine shaft 4 and provided in a row in the circumferential direction. The turbine vanes 32 and the turbine blades 33 are alternately provided along the axial direction. Behind the turbine casing 31, a flue gas chamber 34 including a flue gas diffuser 34a communicating with the turbine 3 is provided.

The turbine shaft 4 is provided rotatably about the axis R with one end on the compressor 1 side supported by a bear in 41 and the other end on the flue gas chamber 34 side supported by a bearing 42. The end of the turbine shaft 4 on the compressor 1 side is connected to a drive shaft of a generator, which is not illustrated.

In the gas turbine 10 as described above, air taken in through the air intake port 11 of the compressor 1 passes by the compressor vanes 13 and the compressor blades 14 and is compressed, thereby becoming high-temperature and high-pressure compressed air. The combustors 2 mix and combust fuel and the compressed air, thereby generating a high-temperature and high-pressure combustion gas. The combustion gas passes by the turbine vanes 32 and the turbine blades 33 of the turbine 3, thereby rotating and driving the turbine shaft 4. The rotational power is supplied to the generator connected to the turbine shaft 4, thereby generating electricity. The flue gas resulting from rotating and driving the turbine shaft 4 passes through the flue gas diffuser 34a of the flue gas chamber 34 and is released as a flue gas to the atmosphere.

Figure 2:
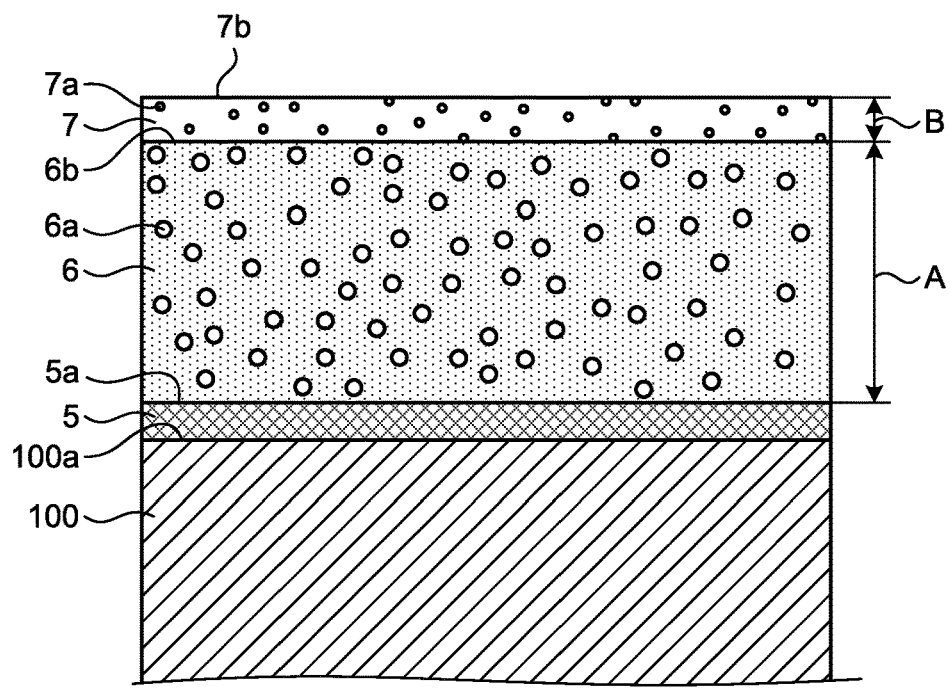
FIG. 2 is a schematic sectional diagram of a thermal barrier coating according to the embodiment of the present invention.

FIG. 2 is a schematic sectional diagram of a thermal barrier coating according to the present embodiment.

The thermal barrier coating (TBC) according to the present embodiment is used for the above-described gas turbine 10, for example. Specifically, as illustrated in FIG. 2, the TBC is formed on a surface 100a of a heat-resistant base 100. The heat-resistant base 100 is a turbine member, such as turbine blades and turbine vanes used for the above-described gas turbine 10.

The TBC illustrated in FIG. 2 includes a metal bonding layer 5, a highly porous layer 6, and a dense layer 7 provided on the surface 100a of the heat-resistant base 100 in this order from the surface 100a.

The metal bonding layer 5 is made of a MCrAlY alloy (N represents a metallic element, such as Ni, Co, and Fe, or a combination of two or more of these elements), for example. The metal bonding layer 5 may be formed on the surface 100a of the heat-resistant base 100 by thermal spraying (low pressure plasma spraying (LPPS), high velocity oxygen fuel (HVOF), or atmospheric plasma spraying (APS)). The MCrAlY alloy is provided as the metal bonding layer 5 on the surface 100a of the heat-resistant base 100, thereby providing a corrosion-resistant function for the hear-resistant base 100 and a function as a binder for the highly porous layer 6.

The highly porous layer 6 is made of ceramic, such as YbSZ (ytterbia-stabilized zirconia having an addition ratio of $Yb_2O_3$ of equal to or higher than 0.01 wt % and equal to or lower than 17.00 wt %) or YSZ (yttria-stabilized zirconia), for example. The highly porous layer 6 may be formed on a surface 5a of the metal bonding layer 5 by APS using YbSZ powder or YSZ powder having a particle size distribution in which the particle diameter of a 10% cumulative particle size is equal to or larger than 30 μm and equal to or smaller than 150 μm. The highly porous layer 6 is a porous structure having a larger number of pores 6a and having a high heat-shielding property as a coating structure. "Having a larger number of pores" means that the pore ratio (vol %) is higher than that of the dense layer 7. The pore ratio of the highly porous layer 6 is equal to or higher than 1 vol % and equal to or lower than 30 vol % (preferably equal to or higher than 10 vol % and equal to or lower than 15 vol %). A layer thickness A of the highly porous layer 6 is equal to or larger than 0.3 mm and equal to or smaller than 1.0 mm. The Vickers hardness (conforming to JIS Z 2244, Vickers hardness test-Test method) of the highly porous layer 6 is equal to or higher than 800 Hv (preferably equal to or higher than 1000 Hv). The highly porous layer 6 has a vertically cracking structure having high durability on a surface 6b. The vertically cracking structure has vertical cracks within a range of equal to or larger than and equal to or smaller than 100% of the layer thickness A of the highly porous layer 6 thickness direction of the highly porous layer 6. The number of vertical cracks per unit length (1 mm) in the section of the highly porous layer 6 is equal to or larger than one and equal to or smaller than ten. With the highly porous layer 6, the TBC has heat-shielding and durability functions.

The dense layer 7 is made of YbSZ (ytterbia-stabilized zirconia having an addition ratio of $Yb_2O_3$ of equal to or higher than 0.01 wt % and equal to or lower than 17.00 wt %) or YSZ (yttria-stabilized zirconia), for example. The dense layer 7 may be formed on the surface 6b of the highly porous layer 6 by short-distance spraying (equal to or shorter than 100 mm) by APS using YbSZ powder or YSZ powder having a particle size distribution in which the average particle diameter is equal to or smaller than 20 μm. The dense layer 7 may be formed on the surface 6b of the highly porous layer 6 by a known method (e.g., the cold spraying method or the aerosol deposition method) for enabling solidification and densification at normal temperature without sintering ceramic fine particles at high temperature. The dense layer 7 is a porous structure having a smaller number of pores 7a as a coating structure. "Having a smaller number of pores" means that the pore ratio (vol %) is lower than that of the highly porous layer 6. The pore ratio of the dense layer 7 is equal to or lower than 0.9 vol % (preferably lower than 0.5 vol %). A layer thickness B of the dense layer 7 is equal to or smaller than 0.05 mm. The Vickers hardness (conforming to JIS Z 2244, Vickers hardness test. Test method) of the dense layer 7 is equal to or higher than 800 Hv (preferably equal to or higher than 1000 Hv). With the dense layer 7, the TBC can have denseness on the outer layer, thereby increasing the penetration preventing property and having a corrosion-resistant function.

As described above, the TEC according to the present embodiment includes the metal bonding layer 5, the highly porous layer 6, and the dense layer 7. The metal bonding layer 5 is formed on the heat-resistant base 100. The highly porous layer 6 is formed on the metal bonding layer 5 and made of ceramic and has the pores 6a. The dense layer 7 is formed on the highly porous layer 6 and made of ceramic and has a pore ratio of equal to or lower than 0.9 vol % that is equal to or lower than that of the highly porous layer 6, a layer thickness of equal to or smaller than 0.05 mm, and a Vickers hardness of equal to or higher than 800 Hv.

This TBC can secure the heat-shielding property, for the heat-resistant base 100, in the highly porous layer 6 bonded to the heat-resistant base 100 with the metal bonding layer 5. With the dense layer 7 formed on the highly porous layer 6 and serving as a hard film having denseness in the pore ratio and the Vickers hardness, the TBC can secure the erosion resistance. Having denseness in the pore ratio of the dense layer 7 can prevent penetration of corrosive components and increase the corrosion resistance. As a result, the TBC can have higher durability in a high-temperature corrosive environment.

In the TBC according to the present embodiment, one of the highly porous layer 6 and the dense layer 7 is preferably made of a YbSZ (ytterbia-stabilized zirconia) material, and the other thereof is preferably made of a YSZ (yttria-stabilized zirconia) material. With the other of the highly porous layer 6 and the dense layer 7 made of the YSZ material, the TBC can be produced at a lower material cost than in a case where the YbSZ material is used. The YSZ material tends to have lower peeling resistance than that of the YbSZ material but has the penetration prevention performance corresponding to the corrosion-resistant function substantially equivalent to that of the YbSZ material.

In an example, the TBC has the structure illustrated in FIG. 2, and the highly porous layer 6 is made of the YbSZ material, and the dense layer 7 is made of the YSZ material. A high-temperature corrosion test was carried out on the TBC as follows: a corrosive component ($Na_2SO_4$) placed on a surface 7b of the dense layer 7 was melted in a high-temperature environment of 920 degrees C., and the state of penetration into the TBC was evaluated by an electron probe micro analyzer (EPMA). In the high-temperature corrosion test, no penetration of the corrosive component was found. In a TBC not including the dense layer 7, penetration of the corrosive component was found. Furthermore, a laser heat cycle test was carried out on the TBC subjected to the heat-temperature corrosion test to evaluate the peeling resistance. The results showed that the TBC had the peeling resistance equivalent to that of the TBC not including the dense layer 7.

In this TBC, one of the highly porous layer 6 and the dense layer 7 is made of the YSZ material, and the other thereof is made of the YbSZ material. Consequently, the TBC can significantly secure the heat-shielding property, for the heat-resistant base 100, in the highly porous layer 6. In addition, the TBC can secure the erosion resistance and significantly increase the corrosion resistance in the dense layer 7. As a result, the TBC can have higher durability in a high-temperature corrosive environment.

In the TBC according to the present embodiment, the highly porous layer 6 and the dense layer 7 are preferably made of the YbSZ material. With the highly porous layer 6 and the dense layer 7 both made of the YbSZ material, the TBC can have high heat-shielding, durability, and corrosion-resistant functions.

In another example, the TBC has the structure illustrated in FIG. 2, and the highly porous layer 6 and the dense layer 7 are made of the YbSZ material. A high-temperature corrosion test was carried out on the TBC as follows: a corrosive component ($Na_2SO_4$) placed on the surface 7b of the dense layer 7 was melted in a high-temperature environment of 920 degrees C., and the state of penetration into the TBC was evaluated by an EPMA. In the high-temperature corrosion test, no penetration of the corrosive component was found. In a TBC not including the dense layer 7, penetration of the corrosive component was found. Furthermore, a laser heat cycle test was carried out on the TBC subjected to the heat-temperature corrosion test to evaluate the peeling resistance. The results showed that the TBC had the peeling resistance equivalent to that of the TBC not including the dense layer 7.

In this TBC, the highly porous layer 6 and the dense layer 7 are made of the YbSZ material. Consequently, the TBC can more significantly secure the heat-shielding property, for the heat-resistant base 100, in the highly porous layer 6. In addition, the TBC can secure the erosion resistance and more significantly increase the corrosion resistance in the dense layer 7. As a result, the TBC can have higher durability in a high-temperature corrosive environment.

Figure 3:
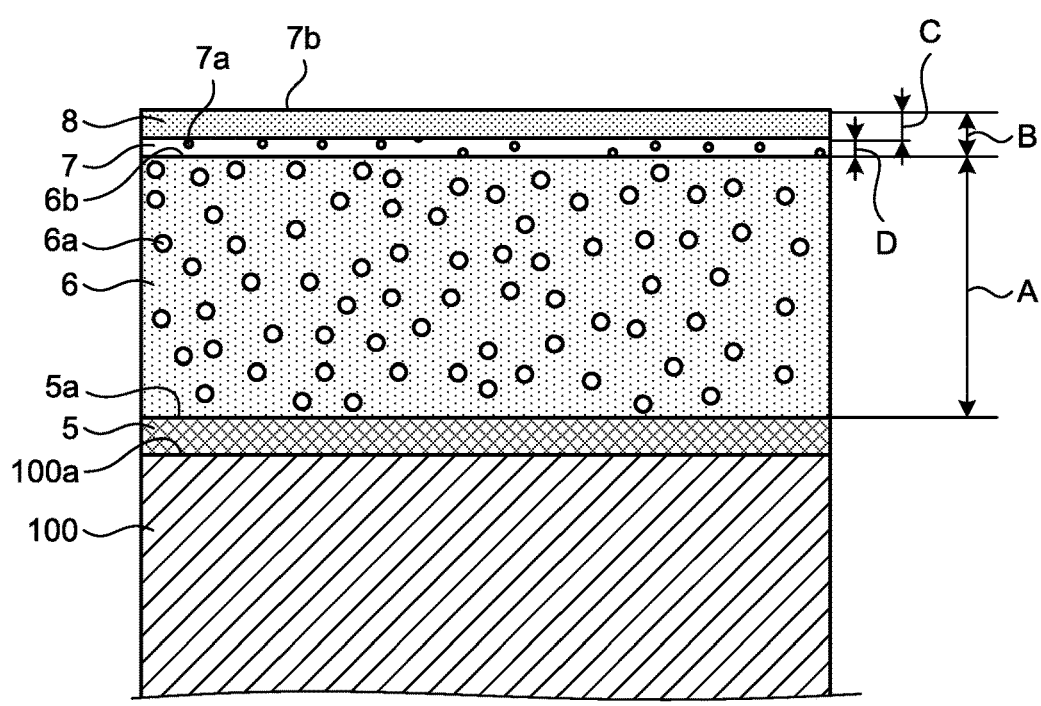
FIG. 3 is a schematic sectional diagram of another example of the thermal barrier coating according to the embodiment of the present invention.

FIG. 3 is a schematic sectional diagram of another example of the TBC according to the present embodiment.

The TBC illustrated in FIG. 3 includes the metal bonding layer 5, the highly porous layer 6, the dense layer 7, and a molten layer 8 provided on the surface 100a of the heat-resistant base 100 in this order from the surface 100a.

Explanation of the metal bonding layer 5, the highly porous layer 6, and the dense layer 7 is omitted because they have the same structure as described above. The dense layer 7 is formed on the surface 6b of the highly porous layer 6 by short-distance spraying (equal to or shorter than 100 mm) by APS using YbSZ powder or YSZ powder having a particle size distribution in which the average particle diameter is equal to or smaller than 20 μm.

The molten layer 8 is formed by melting, by high-speed laser scanning, the outer layer of the dense layer 7 formed by thermal spraying as described above. The high-speed laser scanning is performed so as to leave the dense layer 7 formed on the surface 6b of the highly porous layer 6. A layer thickness D of the dense layer 7 under the molten layer 8 is preferably equal to or larger than 0.01 mm so as not to deteriorate the advantageous effects described above. Because the layer thickness B of the dense layer 7 is equal to or smaller than 0.05 mm, a layer thickness C of the molten layer 8 is equal to or smaller than 0.04 mm (preferably equal to or smaller than 0.03 mm) considering the layer thickness D of the dense layer 7 under the molten layer 8.

The molten layer 8 is formed by melting the outer layer of the dense layer 7 made of the YSZ material or the YbSZ material and having a pore ratio of equal to or lower than 0.9 vol % (preferably lower than 0.5 vol %), and the melting makes the surface 7b of the dense layer 7 denser. Consequently, the TBC can further increase the corrosion resistance. As a result, the TBC can have higher durability in a high-temperature corrosive environment.

While the molten layer 8 may possibly have lower strength because of its high denseness, such a reduction in the strength can be suppressed by making the layer thickness D of the dense layer 7 under the molten layer 8 equal to or larger than 0.01 mm.

While the metal bonding layer 5 according to the embodiment is formed on the heat-resistant base 100 to bond the highly porous layer 6 to the heat-resistant base 100, the highly porous layer 6 may be bonded to the surface 100a of the heat-resistant base 100 without the metal bonding layer 5 depending on the material of the heat-resistant base 100. Consequently, the TBC may have such a structure as illustrated in FIGS. 2 and 3 but that does not include the metal bonding layer 5. Also in this case, the TBC can provide the advantageous effects equivalent to those of the structures illustrated in FIGS. 2 and 3.

REFERENCE SIGNS LIST

1 Compressor
11 Air intake port
12 Compressor casing
13 Compressor vane
14 Compressor blade
2 Combustor
21 Inner cylinder
22 Transition piece
23 Outer casing
24 Combustor casing
25 Air passage
3 Turbine
31 Turbine casing
32 Turbine vane
33 Turbine blade
34 Flue gas chamber
34a Flue gas diffuser
4 Turbine shaft
41, 42 Bearing
5 Metal bonding layer
5a Surface
6 Highly porous layer
6a Pore
6b Surface
7 Dense layer
7a Pore
7b Surface
8 Molten layer
10 Gas turbine
100 Heat-resistant base
R Axis

The invention claimed is:

1. A thermal barrier coating comprising:
a highly porous layer formed on a heat-resistant base, the highly porous layer being made of ceramic; and having pores, the highly porous layer having a layer thickness of equal to or larger than 0.3 mm and equal to or smaller than 1.0 mm, and having a pore ratio of equal to or higher than 1 vol % and equal to or lower than 30 vol %, the highly porous layer being made of an ytterbia-stabilized zirconia material;

a dense layer formed on the highly porous layer, the dense layer having a pore ratio of equal to or lower than 0.9 vol % that is lower than the pore ratio of the highly porous layer, and the dense layer having a layer thickness of equal to or smaller than 0.05 mm and being made of an ytterbia-stabilized zirconia material or an yttria-stabilized zirconia material; and a molten layer formed on the dense layer by melting a portion of the dense layer;

wherein a thickness of the dense layer remaining under the molten layer is equal to or larger than 0.01 mm, and the molten layer has a thickness of equal to or larger than the thickness of the dense layer and no greater than 0.04 mm.

2. The thermal barrier coating according to claim 1, further comprising:

a metal bonding layer formed between the heat-resistant base and the highly porous layer.

3. The thermal barrier coating according to claim 2, wherein the metal bonding layer is made of an MCrAlY alloy, wherein M is a metal comprising Ni, Co, Fe, or a combination thereof.

4. The thermal barrier coating according to claim 1, wherein the dense layer is made of the ytterbia-stabilized zirconia material.

5. The thermal barrier coating according to claim 1, wherein the dense layer has a Vickers hardness of equal to or higher than 800 Hv.

6. The thermal barrier coating according to claim 5, wherein the highly porous layer has a Vickers hardness of equal to or higher than 800 Hv.

7. The thermal barrier coating according to claim 1, wherein the highly porous layer has vertical cracks in a surface where the dense layer is provided.

8. The thermal barrier coating according to claim 7, wherein the vertical cracks of the highly porous layer have one to ten vertical cracks per mm in a surface where the dense layer is provided.

9. The thermal barrier coating according to claim 1, wherein the dense layer has a particle size distribution in which the average particle diameter of ceramic is equal to or smaller than 20 μm.

10. A turbine member comprising the thermal barrier coating according to claim 1 on a surface.

11. The turbine member of claim 7, wherein the turbine member is a compressor blade or vane.

12. A gas turbine comprising the turbine member according to claim 10.

13. A method of producing a thermal barrier coating comprising:

forming a highly porous layer on a heat-resistant base by atmospheric plasma spraying, the highly porous layer being made of ceramic and having pores, the highly porous layer having a layer thickness of equal to or larger than 0.3 mm and equal to or smaller than 1.0 mm, and having a pore ratio of equal to or higher than 1 vol % and equal to or lower than 30 vol %;

forming a dense layer on the highly porous layer by atmospheric plasma spraying, cold spraying method, or an aerosol deposition method, the dense layer being made of ceramic and having a pore ratio of equal to or lower than 0.9 vol % that is lower than the pore ratio of the highly porous layer, and the dense layer having a layer thickness of equal to or smaller than 0.05 mm;

melting a portion of the dense layer to form a molten layer on the dense layer;

wherein a thickness of the dense layer remaining under the molten layer is equal to or larger than 0.01 mm, and the molten layer has a thickness of equal to or larger than the thickness of the dense layer and no greater than 0.04 mm.

14. The method of producing a thermal barrier coating according to claim 13, wherein the dense layer is formed on a surface of the highly porous layer by short-distance spraying of equal to or shorter than 100 mm by the atmospheric plasma spraying.

15. The method of producing a thermal barrier coating according to claim 13, wherein melting the portion of the dense layer is performed by laser scanning the outer surface of the dense layer.

16. The method of producing a thermal barrier coating according to claim 13, further comprising:

prior to forming the highly porous layer, forming a metal bonding layer on the heat resistant base by low pressure plasma spraying (LPPS), high velocity oxygen fuel (HVOF) spraying, or atmospheric plasma spraying (APS).

\* \* \* \* \*